(12) United States Patent
Kohara et al.

(10) Patent No.: US 8,766,524 B2
(45) Date of Patent: Jul. 1, 2014

(54) LEAD-FREE GLASS MATERIAL FOR ORGANIC-EL SEALING, ORGANIC EL DISPLAY FORMED USING THE SAME

(75) Inventors: Yoshihiro Kohara, Kagoshima (JP); Akihiro Ota, Kagoshima (JP); Seungwoo Lee, Seoul (KR)

(73) Assignees: Yamato Electronic Co., Ltd. (JP); Ambro Co., Ltd. (KR)

( * ) Notice: Subject to any disclaimer, the term of this patent is extended or adjusted under 35 U.S.C. 154(b) by 123 days.

(21) Appl. No.: 13/593,165

(22) Filed: Aug. 23, 2012

(65) Prior Publication Data

US 2012/0321902 A1 Dec. 20, 2012

Related U.S. Application Data

(63) Continuation of application No. PCT/JP2010/053670, filed on Mar. 5, 2010.

(51) Int. Cl.
*H01J 31/00* (2006.01)
*C03C 8/20* (2006.01)
*C03C 8/14* (2006.01)

(52) U.S. Cl.
USPC ............................. 313/480; 501/18; 501/17

(58) Field of Classification Search
None
See application file for complete search history.

(56) References Cited

U.S. PATENT DOCUMENTS

| | | | |
|---|---|---|---|
| 2007/0158021 A1 | 7/2007 | Sawai et al. | |
| 2009/0069164 A1 | 3/2009 | Lamberson et al. | |
| 2009/0247385 A1 * | 10/2009 | Ide | 501/18 |

FOREIGN PATENT DOCUMENTS

| | | |
|---|---|---|
| JP | 10074583 A | 3/1998 |
| JP | 2001319775 A | 11/2001 |
| JP | 2004250276 A | 9/2004 |
| JP | 2006524419 A | 10/2006 |
| JP | 2006342044 A | 12/2006 |
| JP | 2007182347 A | 7/2007 |
| JP | 2007200843 A | 8/2007 |
| JP | 2008527656 A | 7/2008 |
| WO | 2004095597 A2 | 11/2004 |
| WO | 2007067402 A2 | 6/2007 |

OTHER PUBLICATIONS

International Search Report; Application No. PCT/JP2010/053670; Issued: May 6, 2010; Mailing Date: May 18, 2010; 2 pages.

* cited by examiner

*Primary Examiner* — Anh Mai
*Assistant Examiner* — Brenitra M Lee
(74) *Attorney, Agent, or Firm* — St. Onge Steward Johnston & Reens LLC

(57) ABSTRACT

A lead-free glass material for sealing organic EL elements is provided with which satisfactory sealing quality is obtained through laser sealing without requiring the addition of a metallic powder. The lead-free glass material for sealing organic EL elements has a glass composition which comprises, in terms of mol %, 30-60% $V_2O_5$, 5-20% ZnO, 5-20% BaO, 15-40% $TeO_2$, 0-7% $Nb_2O_5$, 0-7% $Al_2O_3$, 0-5% $SiO_2$, 0-5% MgO, 0-5% $Sb_2O_3$, 0-4% CuO, and 0-4% SnO and in which $Nb_2O_5+Al_2O_3$ is 0.5-10%, $SiO_2+MgO+Sb_2O_3$ is 0-5%, and CuO+SnO is 0-4%. The glass material has low-temperature softening properties, melt stability, and a low coefficient of thermal expansion and is inhibited from thermally adversely affecting organic EL elements The glass material can attain high sealing properties and high sealing strength in high yield.

10 Claims, 1 Drawing Sheet

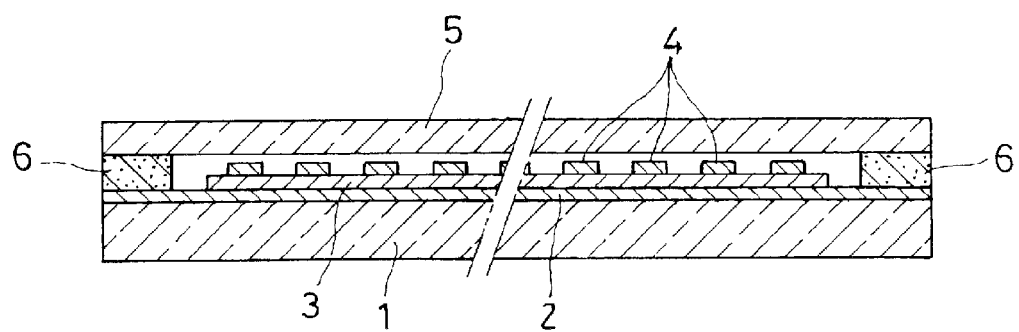

LEAD-FREE GLASS MATERIAL FOR ORGANIC-EL SEALING, ORGANIC EL DISPLAY FORMED USING THE SAME

CROSS-REFERENCE TO RELATED APPLICATIONS

The present application is a continuation of pending International patent application PCT/JP2010/053670 filed on Mar. 5, 2010 which designates the United States, the content of which is incorporated herein by reference.

FIELD OF THE INVENTION

The present invention relates to a lead-free glass material for organic-EL sealing used for sealing a display employing an organic electroluminescence (EL) element, an organic EL display between whose panel peripheral portions are sealed by the lead-free glass material.

BACKGROUND OF THE INVENTION

A self-luminous organic EL display employing an organic light emitter such as diamines has been the focus of attention in recent years as a next-generation flat panel display in place of a liquid crystal display (LCD) and a plasma display panel (PDP). As shown in FIG. 1 for example, this organic EL display has a structure that an EL element substrate 1 made of glass has one of the surfaces (an inner surface) formed with, sequentially from the bottom, a lower electrode 2 in a parallel striped pattern, an organic light-emitting layer 3, and an upper electrode 4 in a parallel striped pattern extending along an orthogonal direction to the lower electrode 2, and that between peripheral portions of the EL element substrate 1 and a sealing glass plate 5 arranged opposed thereto are sealed by a sealing layer 6.

This kind of organic EL display has many advantages; the display has high luminance, high contrast, and excellent display recognizability, can be formed extremely thin in thickness, is applicable also to an ultra-thin display having a total thickness of 1 mm or thinner for use in small devices such as a cell-phone (a cellular mobile telephone) and a digital camera, can be constructed of solid materials in its entirety, and is driven with direct current, so that a driving circuit thereof is simplified. On the other hand, there is a drawback that luminescence characteristics of the organic EL element are significantly deteriorated by contact with moisture. Therefore, the establishment of a sealing technique for cutting off the organic EL element from the outside air has been a major challenge.

At present, a sealing method with use of glass frits and a laser is considered to be the leading candidate as a sealing means for the organic EL display. That is, the glass frits form a sealing glass layer in such a manner that a powder mixture whose components are mainly metal oxides is heated, melted, vitrified, and then pulverized into a powder and the power is brought into paste form by a solution in which an organic binder is usually dissolved in an organic solvent, and the paste is coated on a sealed portion and melted again by heating. Recently, glass frits of a variety of glass compositions free from toxic lead are in practical use and frequently used for sealed portions for keeping an interior of LCDs, PDPs, and vacuum fluorescent displays (VFDs) under high vacuum. Therefore, the glass frits are considered suitable also for cutting off a moisture-sensitive organic EL element from the outside air. However, a sealing temperature of general glass frits is 400° C. or more, so that the organic EL display may have a problem in sealing by in-furnace heating that an organic EL element is damaged or thermally degraded under the influence of high temperature. Thus, promising in sealing of the organic EL display is a method that a laser beam is irradiated on panel peripheral portions between which the glass frits intervene, and only the glass frits are locally heated and melted, and then thermal adverse effects on the organic EL element are suppressed (Patent Documents 1 to 4). It is noted that such laser sealing also has the advantage that a sealing time can be reduced greatly as compared with the sealing by in-furnace heating.

PRIOR ART DOCUMENTS

Patent Documents

Patent Document 1: Japanese Unexamined Patent Application Publication No. H10-74583.
Patent Document 2: Japanese Unexamined Patent Application Publication No. 2001-319775.
Patent Document 3: Japanese Translation of International Application (Kohyo) No. 2006-524419.
Patent Document 4: Japanese Unexamined Patent Application Publication No. 2007-200843.

SUMMARY OF THE INVENTION

Problems to be Solved by the Invention

In the above-described sealing with use of the glass frits and the laser, glass frits with high absorbability of a laser beam need to be used in achieving good sealing quality. However, glass frits frequently used in sealing for flat panel displays heretofore generally have a bright color tone and are inferior in absorbability of a laser beam. Thus, a metal powder such as iron and manganese needs to be added to improve the absorbability, which disadvantageously leads to high material costs, renders preparation of the frits laborious, and reduces insulation properties. On the other hand, the glass frits are preferably softened at a lower temperature in order to reduce the thermal adverse effects on the organic EL element, even when the laser sealing is performed. Further, a thermal expansion coefficient of the glass frits needs to be brought close to that of the glass substrate in order to ensure the sealing and enhance the sealing strength. In addition, where the sealing is continuously performed in mass production of the organic EL display, the glass frits are preferably highly stable and unlikely to undergo a crystal deposition during melting in order to loosen sealing conditions and suppress occurrence of an error due to variations in the conditions. Hence, the conventional glass frits cannot exhibit satisfactory performance in terms of low-temperature softening properties, thermal expansion coefficients, and stability, etc.

In view of the above-described circumstances, the present invention mainly aims to provide a lead-free glass material for organic-EL sealing, capable of exhibiting high absorbability with respect to a laser beam without adding a metal powder, therewith achieving good sealing quality through laser sealing, the glass material also having excellent low-temperature softening properties and melt stability, having a small thermal expansion coefficient, and while being capable of sufficiently suppressing thermal adverse effects on the organic EL element by reducing the heat input amount in sealing, being produced in high yield without strict management and control of sealing conditions, and achieving high sealability and great sealing strength. Another object of the present invention is to provide an organic EL display with excellent quality by using the above-described lead-free glass material for organic-EL sealing.

Means for Solving the Problems

In order to achieve the above objects, a lead-free glass material for organic-EL sealing according to the first aspect of the present invention includes a glass composition containing, in terms of mol %, 30 to 60% $V_2O_5$, 5 to 20% ZnO, 5 to 20% BaO, 15 to 40% $TeO_2$, 0 to 7% $Nb_2O_5$, 0 to 7% $Al_2O_3$, 0 to 5% $SiO_2$, 0 to 5% MgO, 0 to 5% $Sb_2O_3$, 0 to 4% CuO, and 0 to 4% SnO, wherein $Nb_2O_5+Al_2O_3$ is 0.5 to 10%, $SiO_2+MgO+Sb_2O_3$ is 0 to 5%, and CuO+SnO is 0 to 4%.

A lead-free glass material for organic-EL sealing according to the second aspect of the present invention includes a glass composition containing, in terms of mol %, 35 to 55% $V_2O_5$, 10 to 18% ZnO, 5 to 18% BaO, 15 to 30% $TeO_2$, 0 to 7% $Nb_2O_5$, 0 to 5% $Al_2O_3$, 0 to 5% $SiO_2$, 0 to 5% MgO, 0 to 5% $Sb_2O_3$, 0 to 4% CuO, and 0 to 4% SnO, wherein $Nb_2O_5+Al_2O_3$ is 2 to 8%, and $SiO_2+MgO+Sb_2O_3$ is 0 to 5%, and CuO+SnO is 0 to 4%.

The third aspect of the present invention is configured such that $SiO_2+MgO+Sb_2O_3$ in the glass composition is 0.5 to 5 mol % in the lead-free glass material for organic-EL sealing as set forth in the first or second aspect.

The fourth aspect of the present invention is configured such that CuO+SnO in the glass composition is 0.5 to 4 mol % in the lead-free glass material for organic-EL sealing as set forth in-the first or second aspects.

The fifth aspect of the present invention is configured such that a glass powder of the above glass composition is mixed with a filler in a range of ratio by weight of the glass powder to the filler of 50:50 to 99:1 in the lead-free glass material for organic-EL sealing as set forth in-the first or second aspects.

An organic EL display according to the sixth aspect of the present invention is configured such that between the peripheral portions of opposed glass substrates are sealed the lead-free glass material for organic-EL sealing as set forth in the first or second aspects.

The seventh aspect of the present invention is configured such that the glass substrates have a thermal expansion coefficient of $35 \times 10^{-7}$/° C. to $50 \times 10^{-7}$/° C. in the organic EL display of the sixth aspect.

An organic EL display according to the eighth aspect of the present invention includes the steps of placing the lead-free glass material for organic-EL sealing as set forth in the first or second aspects between peripheral portions of opposed glass substrates of the organic EL display, heating and melting the glass material by irradiation of a laser beam, and sealing between the peripheral portions of the both glass substrates.

An organic EL display according to the ninth aspect of the present invention includes the steps of adding an organic binder solution to a powder of the lead-free glass material for organic-EL sealing as set forth in the first or second aspects, preparing a frit paste, coating at least one of the peripheral portions of a pair of glass substrates to be arranged opposed to each other of the organic EL display with the frit paste, preliminarily firing at a temperature of softening point plus 50° C. to 120° C., volatilizing and removing organic components of the coated layer, superimposing the both glass substrates via the coated layer, melting glass components of the coated layer by irradiation of a laser beam, and sealing between the peripheral portions of the both glass substrates.

Effects of the Invention

According to the first aspect of the present invention, the lead-free glass material for organic-EL sealing has a glass composition containing four components of $V_2O_5$, ZnO, BaO, and $TeO_2$ and at least one of $Nb_2O_5$ and $Al_2O_3$ at respective specific ratios as essential components. Therefore, provided is the glass material which has a low glass transition point and softening point, is superior in low-temperature workability, has a small thermal expansion coefficient, is excellent in fluidity and stability in melting, has good absorbability of a laser beam, and is capable of ensuring good display performance by suppressing a thermal shock to an organic EL element through the use of laser sealing with less heat input amount, being produced in high yield without strict management and control of sealing conditions, and achieving high sealability and great sealing strength.

According to the second aspect of the present invention, the lead-free glass material for organic-EL sealing containing the above four components of $V_2O_5$, ZnO, BaO, and $TeO_2$ and at least one of $Nb_2O_5$ and $Al_2O_3$ as essential components has a glass composition in which respective components are at more preferable ratios. Therefore, provided is the glass material which is far superior in low-temperature workability and can achieve high sealing quality by reliably avoiding a thermal shock to an organic EL element through the use of laser sealing.

According to the third aspect of the present invention, the material contains not only the above four components of $V_2O_5$, ZnO, BaO, and $TeO_2$ and at least one of $Nb_2O_5$ and $Al_2O_3$ but also at least one kind of component selected from $SiO_2$, MgO, and $Sb_2O_3$ at specific ranges as essential components. Therefore, there are advantages that the thermal expansion coefficient becomes even smaller and conformity with thermal expansivity of the glass substrate of the organic EL display is further facilitated.

According to the fourth aspect of the present invention, the material contains not only the above four components of $V_2O_5$, ZnO, BaO, and $TeO_2$ and at least one of $Nb_2O_5$ and $Al_2O_3$ but also at least one of CuO and SnO at specific ranges as essential components. Therefore, there are advantages that the thermal expansion coefficient becomes much smaller and conformity with thermal expansivity of the glass substrate of the organic EL display is further facilitated.

According to the fifth aspect of the present invention, a specific amount of a filler is mixed with a glass powder of the above-described glass composition in the above lead-free glass material for organic-EL sealing. The thermal expansion coefficient of the sealing glass layer can be reliably brought close to the thermal expansivity of the glass substrate of the organic EL display to increase sealability and improve strength of the sealing glass layer.

According to the sixth aspect of the present invention, the organic EL display has opposed glass substrates between whose peripheral portions are sealed the above-described lead-free glass material for organic-EL sealing. Therefore, provided is the display in which an organic EL element in the interior is completely cut off from the outside air, and sealed portions have excellent sealing strength, and therefore good display performance can be stably exhibited for a long period of time.

According to the seventh aspect of the present invention, thermal expansivities of the glass substrate and the sealing glass layer are easily matched in the organic EL display having the thermal expansion coefficient of the glass substrate in a specific range. Thus, an organic EL display having high sealing quality and far superior durability is provided.

According to the organic EL display in accordance with the eighth aspect of the present invention, the above-described lead-free glass material for organic-EL sealing is placed between peripheral portions of opposed glass substrates of the organic EL display, and then the glass material is heated and melted by irradiation of a laser beam to seal between the peripheral portions of the both glass substrates. Therefore, the organic EL display having good sealing quality and excellent durability can be mass-produced with high efficiency and in high yield without strict management and control of sealing conditions while a thermal shock to the organic EL element can be suppressed by reducing the heat input amount involved in sealing.

According to the organic EL display in accordance with the ninth aspect of the present invention, the above-described lead-free glass material for organic-EL sealing is brought into paste form and the peripheral portions of the glass substrates are coated therewith. Preliminarily firing at a specific temperature is carried out to volatilize and remove organic components of the coated layer. After that, both glass substrates are superimposed via the coated layer and then laser-sealed. Therefore, heat input amount at the time of laser sealing can be further decreased, and thermal adverse effects on the organic EL element can be further reduced. Furthermore, advantageously, assembling operation of parts in preparation to sealing can be carried out easily and reliably.

BRIEF DESCRIPTION OF THE DRAWING

FIG. 1 is a longitudinal sectional side view showing a schematic configuration example of an organic EL display panel to which the present invention is applied.

DETAILED DESCRIPTION OF THE INVENTION

Modes for Carrying Out the Invention

A lead-free glass material for organic-EL sealing according to the present invention basically includes at least one of $Nb_2O_5$ and $Al_2O_3$ as an essential component in addition to a glass composition of a quaternary system of $V_2O_5$—$ZnO$—$BaO$—$TeO_2$. As compared with a lead-free glass material of a glass composition composed of four components of $V_2O_5$—$ZnO$—$BaO$—$TeO_2$, the claimed glass material has excellent low-temperature workability, exhibits good fluidity and vitreous luster at low melting temperature, has a remarkably small coefficient of thermal expansion, takes on a relatively dark color tone, has high absorbability of a laser beam, and has excellent water resistance and chemical resistance as well. Accordingly, if the claimed lead-free glass material is used to seal between the glass substrates of the organic EL display, the laser sealing can be performed with less heat input amount and thermal adverse effects on the organic EL element can be steadily suppressed. Additionally, thermal expansivities of the glass substrate and the sealing glass layer are easily matched, wherewith extremely excellent sealability and great sealing strength can be provided and water resistance and chemical resistance of the sealing glass layer are improved. Consequently, the resulting organic EL display has excellent durability and can exhibit high display performance over a long period of time.

Each component ratio of such lead-free glass material for organic-EL sealing shall be such that, in terms of mol %, $V_2O_5$ is 30 to 60%, ZnO is 5 to 20%, BaO is 5 to 20%, $TeO_2$ is 15 to 40%, $Nb_2O_5$ is 0 to 7%, $Al_2O_3$ is 0 to 7%, and a total amount of $Nb_2O_5$ and $Al_2O_3$ is 0.5 to 10%. As shown in thermal characteristics of examples described later, such glass composition has a softening point [Tf] less than 320° C. and a glass transition point [Tg] less than 300° C., so that sealing processing at low temperature is possible. The glass composition also has a small thermal expansion coefficient of $110 \times 10^{-7}$/° C. to $130 \times 10^{-7}$/° C., and generally takes on a seal brown color shade (very dark brown, darker than a dark brown shade) which excels in absorbability of a laser beam.

If the proportion of $V_2O_5$ is too high in the above glass composition, there is a concern about devitrifying in laser sealing. If the proportion is too low, low-temperature workability is reduced and thermal expansivity is increased due to a rise of the glass transition point [Tg] and softening point [Tf]. If any proportions of ZnO, BaO, and $TeO_2$ are too high, the vitrification is inhibited and the components are likely unable to be melted or likely to remain unmelted. On the contrary, if the proportions are too low, there is a concern about devitrifying in laser sealing.

As for $Nb_2O_5$ and $Al_2O_3$, single use of either of them or a combined use of them within the above-specified range significantly improves the low-temperature workability, drastically decreases the thermal expansion coefficient, enhances glass stability, and increases water resistance and chemical resistance as well. When each of $Nb_2O_5$ and $Al_2O_3$ exceeds 7 mol % or a total amount of the both exceeds 10 mol %, the low-temperature workability is conversely reduced even if the thermal expansion coefficient is further decreased. It is noted that a sufficient mixing effect cannot be achieved when the total amount of the both is less than 0.5 mol %. The glass stability can be improved by rendering a mixing amount of $TeO_2$ larger than the above-specified range. On that occasion, however, there is a problem that the thermal expansion coefficient significantly increases.

Accordingly, a more preferable glass composition is such that, in terms of mol %, $V_2O_5$ is in the range of 35 to 55%, ZnO is in the range of 10 to 18%, BaO is in the range of 5 to 18%, $TeO_2$ is in the range of 15 to 30%, $Nb_2O_5$ is in the range of 0 to 7%, $Al_2O_3$ is in the range of 0 to 5%, and a total amount of $Nb_2O_5$ and $Al_2O_3$ is in the range of 2 to 8%, respectively.

Furthermore, the lead-free glass material for organic-EL sealing of the present invention may be mixed with a variety of other oxide components if necessary besides the above six kinds of components of $V_2O_5$, ZnO, BaO, $TeO_2$, $Nb_2O_5$, and $Al_2O_3$. Particularly preferred ones among such given mixed components include five kinds; $SiO_2$, MgO, $Sb_2O_3$, CuO, and SnO. However, if $B_2O_3$ which is generally frequently used as a component of lead-free glass materials for sealing is additionally mixed into the above-described glass composition, the glass transition point (Tg) and the softening point (Tf) are increased and the fluidity in a molten state is also reduced. Therefore, practically, the glass composition desirably does not contain $B_2O_3$.

Three kinds of components of $SiO_2$, MgO, and $Sb_2O_3$ among the above preferred given components all have the effect of lowering the thermal expansion coefficient by being additionally mixed into the above glass composition. However, a too large mixing amount inhibits the low-temperature workability. Therefore, the mixing amount of the three components shall be 0 to 5 mol % in individual use and 0 to 5 mol % even in the total amount ($SiO_2$+MgO+$Sb_2O_3$). However, the mixing effect is not seen if the total amount is less than 0.1 mol %. In order to achieve a sufficient mixing effect practically, the total amount is preferably in the range of 0.5 to 5 mol %.

Two kinds of components, CuO and SnO among the above preferred given components also have the effect of lowering the thermal expansion coefficient by being additionally mixed. However, a too large mixing amount facilitates the crystallization and significantly reduces the fluidity in a molten state. Accordingly, the mixing amount of the two components shall be 0 to 4 mol % in individual use and 0 to 4 mol % even in the total amount (CuO+SnO). However, the mixing effect is not practically seen if the total amount is less than 0.1 mol %. In order to achieve a sufficient mixing effect, the total amount is preferably in the range of 0.5 to 4 mol %.

In order to manufacture the lead-free glass material for organic-EL sealing of the present invention, a powder mixture of raw material is put into a pot such as a platinum crucible, fired within a heating furnace such as an electric furnace for a predetermined time, melted, and vitrified. This melt is poured into an appropriate form such as an alumina boat and cooled down. A resulting glass block may be pulverized into an appropriate particle size by a pulverizer to form glass frits. It is suitable that the glass frits have a particle size in the range of 0.05 to 100 µm. Coarse particles produced by the above-described pulverization have only to be classified and removed. However, for glass frits used for a sealant of an ultra-thin display for a small device, it is recommended that the particle size is 10 µm or smaller, and more preferably 6 µm or smaller.

In the above pulverization, a variety of pulverizers such as a jet mill conventionally commonly used in glass frit manufacturing can be used. It is advisable to employ wet pulverization to obtain a fine particle size, in particular, 3 µm or smaller. This wet pulverization is to pulverize in an aqueous solvent like a water or alcohol aqueous solution, by using alumina or zirconia media (balls) with a diameter of 5 mm or smaller or using a beads mill. The wet pulverization can pulverize much finer than jet mill grinding but is a fine grinding process using an aqueous solvent. Thus, a glass composition which is an object to be pulverized needs to have high water resistance. The glass material of the present invention is suited in this respect as well.

In addition to that the glass powder (glass frits) having the above-described glass composition is used alone, the lead-free glass material for organic-EL sealing of the present invention may take a form of a mixture in which a filler such as a filling material or an aggregate is mixed with the glass powder. The mixing of such filler lowers the thermal expansion coefficient of the sealing glass layer. Thus, the thermal expansivity of the sealing glass layer can be easily matched to that of the glass substrate of the organic EL display by adjusting the mixing amount of the filler. In the form of the mixture, the glass component serves as a binder which binds filler particles together at the time of heating and melting. Therefore, the resulting sealing glass layer becomes a sintered body in a high-strength and compact ceramic form.

The above filler may be any material as long as the filler has a melting point higher than the glass component and is not melted at a firing temperature in the processing. The filler is not particularly restricted in kind, but preferred are powders of, such as zirconium silicate, cordierite, zirconium phosphate, β-eucryptite, β-spodumene, zircon, alumina, mullite, silica, β-quartz solid solution, zinc silicate, and aluminium titanate, for example. It is advisable that the mixing amount of the filler is in the range of ratio by weight of the glass powder to the filler of 50:50 to 99:1. If the mixing amount is too large, the fluidity in melting is reduced and a binding capacity of the glass composition becomes deficient and thus a strong sintered body cannot be formed.

The thermal expansion coefficient of the glass substrate used for the organic EL display is generally about $35 \times 10^{-7}/°$C. to $50 \times 10^{-7}/°$C. In the lead-free glass material for organic-EL sealing, on the other hand, the thermal expansion coefficient of the glass powder itself is small, and accordingly, the thermal expansion coefficient of the sealing glass layer can be lowered to about $50 \times 10^{-7}/°$C. with the fluidity in a molten state being sufficiently secured, through adjustment by the mixing of the filler. On the other hand, in the lead-free glass material of the glass composition composed of four components, $V_2O_5$—$ZnO$—$BaO$—$TeO_2$ as described earlier, the thermal expansion coefficient of the sealing glass layer can be lowered only to about $60 \times 10^{-7}/°$C. in securing the fluidity in a molten state even when adjustment by the mixing of the filler is made.

The glass powder (glass frits) of the lead-free glass material for organic-EL sealing of the present invention and the mixed powder in which the above-described filler is mixed with the glass powder are subject to firing after being formed into a paste which is dispersed with a high concentration generally in an organic binder solution and then coating a peripheral portion of at least one of the glass substrates to be arranged opposed to each other of the organic EL display panel with the paste by screen printing, etc. Thus, the powders may be manufactured in a paste form beforehand.

The organic binder solution used for the above paste has no particular restrictions, and includes for example a solution in which a binder of celluloses such as nitrocellulose or ethyl cellulose is dissolved in a solvent of butyl carbitol acetate, butyl diglycol acetate, terpineol, pine oil, aromatic hydrocarbons solvent, or a mixed solvent such as a thinner, and a solution in which an acrylic resin binder is dissolved in a solvent of ketones, esters, and low-boiling aromatics, etc. The viscosity of the paste is advisably in the range of 30 to 3000 dPa·s in terms of coating workability.

The sealing processing with use of the lead-free glass material for organic-EL sealing of the present invention includes placing the glass material between peripheral portions of glass substrates opposed to each other of an organic EL display panel, heating and melting the glass material, and sealing between the peripheral portions of the both glass substrates. At that moment, the glass material could be placed between the both glass substrates in a form of a powder or thin plate. However, a method of coating the glass material in the paste form on at least one of the glass substrates (usually, on a sealing glass plate side to which the organic EL element is not adhered) is recommended in order to form an ultra-thin sealing glass layer. Further, the heating and melting of the glass material can be performed by holding the material in a high temperature atmosphere within a heating furnace, but is advisably performed by local heating by means of laser beam irradiation as already described in order to avoid thermal degradation of the organic EL element. Since the glass powder takes on a seal brown which is excellent in absorbability of a laser beam as already described, the laser sealing can be applied without any problem even when the conventional metal powder is not included.

The heat treatment of this sealing processing can be performed at one time. However, the treatment is advisably performed in two steps to improve sealing quality. That is, first as a preliminary firing, vehicle components (the binder and the solvent) of the paste are volatilized, pyrolytically decomposed, and are brought into a state where only frit components are left, by heating to near the softening point [Tf] of the glass material. Subsequently as a main firing, a sealing glass layer in which the glass components are completely melted and integrated is formed by local heating with use of laser beam irradiation.

According to such two-step heat treatment, the vehicle components are volatilized and removed at the first step of preliminary firing and the glass components are fused with each other at the second step of main firing. Thus, air bubbles and pin holes due to deairing can be prevented from being formed within the sealing glass layer. As a result, sealing reliability and strength of sealed portions can be improved. Particularly in the organic EL display panel, the organic EL element which is easily thermally degraded is arranged inside and the sealed portions are sealed and fixed while electrodes, lead wires, exhaust pipes, etc., are interposed between the sealed portions. Therefore, thermal adverse effects on the organic EL element can be further reduced by performing the first-step heat treatment only on an unassembled glass substrate having been coated with the paste and then using the glass substrate and other necessary members to assemble into a form of a product, and performing the second-step heat treatment in the assembled state.

In the schematic configuration shown in FIG. 1 as already described, the organic EL display panel of the present invention is composed of a sealing glass layer in which a sealing layer 6 is formed by using the above-described lead-free glass material for organic-EL sealing of the present invention. The sealing layer 6 has a high airtightness retaining ability as a melted and solidified substance of the glass frits, and also has excellent adhesion and adhered strength with respect to surfaces of the both glass substrates to be arranged opposed to each other, that is, the EL element substrate 1 and the sealing glass plate 5. Thus, the sealing layer 6 provides high sealability and large sealing strength, and additionally exhibits good water resistance and chemical resistance. Consequently, this organic EL display panel is superior in durability of the sealed portions and can exert good display performance stably over a long period of time. Additionally, there is no need to arrange a water capturing agent or drying agent inside the package. The panel configuration is simplified accordingly, and assembling and production can be performed easily at a low cost. Since moisture is unlikely to be adsorbed on the glass material superior in water resistance, steam is not produced as outgas from the glass frits in the sealing processing. There is also no concern that the steam enters into the package and deteriorates the organic EL element.

EXAMPLES

Hereinafter, the present invention is described concretely by using examples. Raw material oxides used in the following were all special grade reagents made by Wako Pure Chemical Industries, Ltd. Likewise, special grade reagents were used for other analytical reagents as well.

Manufacturing Example 1

A mixture (10 g in total) in which respective powders of $V_2O_5$, ZnO, BaO, $TeO_2$, $Nb_2O_5$, $Al_2O_3$, $SiO_2$, MgO, $Sb_2O_3$, CuO, SnO, and $B_2O_3$ as raw material oxides have been mixed at ratios (mol %) listed in Tables 1 to 3 as shown below was stored in a platinum crucible, heated within an electric furnace at about 1000° C. for 60 minutes, and melted. After that, the melt was poured into an alumina boat and a glass bar was made. The glass bar was cooled down in the atmosphere and then ground by an automatic mortar. The ground substances were classified and ones having a particle diameter of 100 μm or smaller were collected. Then, powder lead-free glass materials No. 1 to 29 were made.

The lead-free glass materials No. 1 to 29 having been made by the above-described method were examined for glass transition point [Tg], softening point [Tf], crystallization onset temperature [Tx], thermal expansion coefficient, fluidity and vitreous luster in a molten state, and color shade. The results are shown in the following Tables 1 to 3. Measuring methods for respective items are as follows.

[Glass Transition Point, Softening Point, and Crystallization Onset Temperature]
α-Alumina was used as a reference (a standard sample), and the glass transition point [Tg], softening point [Tf], and crystallization onset temperature [Tx] of the samples were measured by a differential thermal analyzer (under the designation, TG-8120 of Rigaku Corporation) under measuring conditions of a heating rate of 10° C. per minute and a temperature range of 25° C. (room temperature) to 600° C.

[Thermal Expansion Coefficient]
The thermal expansion coefficient was measured by a thermal mechanical analyzer (under the designation, TMA8310 of Rigaku Corporation). This measurement employed, as measurement samples, rectangular columns of 5×5×20 mm (length×width×height) with a flat upper base surface into which the lead-free glass material powders were melted again and molded. The temperature was increased from room temperature to 250° C. at a rate of 10° C. per minute, and an average thermal expansion coefficient α was obtained. Quartz glass was used as a standard sample.

[Fluidity/Vitreous Luster]
Each lead-free glass material was melted and hardened in a mold and made into a button-like molded sample having a diameter of 8.8 mm and a thickness of 2.0 mm. While placed on a glass substrate, the molded sample was heated in an electric furnace at a heating rate of 10° C. per minute to increase the temperature. The sample was maintained for 10 minutes at 420° C., 450° C., and 500° C. respectively, and then cooled down to the room temperature. Changes in state of the molded sample were observed and an evaluation was made on a scale of the following four categories.

A . . . Showing good fluidity and vitreous luster at less than 420° C.
B . . . Showing good fluidity and vitreous luster from 420° C. to less than 450° C.
C . . . Showing good fluidity and vitreous luster from 450° C. to less than 500° C.
D . . . Showing not good fluidity and vitreous luster at less than 500° C.

TABLE 1

| | | Lead-free glass material No. | | | | | | | | | |
|---|---|---|---|---|---|---|---|---|---|---|---|
| | | 1 | 2 | 3 | 4 | 5 | 6 | 7 | 8 | 9 | 10 |
| Glass composition (mol %) | $V_2O_5$ | 36.0 | 41.4 | 38.3 | 47.2 | 43.6 | 47.2 | 40.4 | 40.4 | 36.1 | 46.0 |
| | ZnO | 13.4 | 13.2 | 12.2 | 15.1 | 14.0 | 15.1 | 12.8 | 12.8 | 11.5 | 14.7 |
| | BaO | 21.3 | 14.0 | 13.0 | 16.0 | 14.8 | 16.0 | 13.7 | 13.7 | 12.2 | 15.6 |
| | $TeO_2$ | 29.3 | 28.9 | 26.6 | 19.2 | 17.7 | 19.2 | 28.1 | 28.1 | 25.2 | 18.7 |
| | $Nb_2O_5$ | — | 2.5 | 10.0 | 2.5 | 10.0 | — | — | 2.5 | 10.0 | 2.5 |
| | $Al_2O_3$ | — | — | — | — | — | 2.5 | 5.0 | 2.5 | 5.0 | 2.5 |
| Glass transition point Tg (° C.) | | 297 | 275 | 305 | 280 | 310 | 285 | 295 | 290 | 312 | 285 |

TABLE 1-continued

|  | Lead-free glass material No. | | | | | | | | | |
|---|---|---|---|---|---|---|---|---|---|---|
|  | 1 | 2 | 3 | 4 | 5 | 6 | 7 | 8 | 9 | 10 |
| Softening point Tf (° C.) | 311 | 285 | 325 | 292 | 330 | 302 | 316 | 302 | 339 | 298 |
| Crystallization onset temperature Tx (° C.) | 432 | 380 | 480 | 400 | 510 | 425 | 443 | 450 | 550 | 450 |
| Thermal expansion coefficient ($\times 10^{-7}$/° C.) | 146 | 130 | 110 | 128 | 105 | 119 | 115 | 120 | 100 | 110 |
| Fluidity/vitreous luster | B | A | B | A | B | A | A | A | B | A |
| Color shade | Seal brown | Seal brown | Seal brown | Seal brown | Seal brown | Seal brown | Seal brown | Seal brown | Seal brown | Seal brown |

TABLE 2

|  |  | Lead-free glass material No. | | | | | | | | | |
|---|---|---|---|---|---|---|---|---|---|---|---|
|  |  | 11 | 12 | 13 | 14 | 15 | 16 | 17 | 18 | 19 | 20 |
| Glass composition (mol %) | $V_2O_5$ | 41.1 | 42.2 | 41.4 | 41.4 | 41.4 | 42.2 | 41.1 | 44.0 | 44.0 | 42.7 |
|  | ZnO | 13.2 | 13.4 | 13.4 | 13.1 | 13.1 | 13.4 | 13.0 | 14.0 | 14.0 | 13.6 |
|  | BaO | 13.9 | 14.3 | 14.0 | 9.3 | 5.5 | 14.3 | 13.9 | 12.4 | 9.9 | 14.5 |
|  | $TeO_2$ | 16.7 | 26.0 | 25.5 | 25.4 | 25.4 | 26.0 | 25.2 | 27.1 | 27.1 | 26.3 |
|  | $Nb_2O_5$ | 10.0 | 2.0 | 2.0 | 3.9 | 3.9 | 0.5 | 1.0 | — | — | — |
|  | $Al_2O_3$ | 5.0 | 1.0 | 2.5 | 2.0 | 2.0 | 1.0 | 4.5 | — | — | — |
|  | $SiO_2$ | — | 1.0 | 1.5 | 0.5 | 0.5 | 1.0 | 1.0 | — | — | — |
|  | MgO | — | — | — | 4.4 | 8.2 | — | — | 2.5 | 5.0 | — |
|  | $Sb_2O_3$ | — | — | — | — | — | 1.5 | 0.5 | — | — | 3.0 |
| Glass transition point Tg (° C.) | | 305 | 285 | 288 | 293 | 298 | 295 | 286 | 285 | 288 | 302 |
| Softening point Tf (° C.) | | 335 | 297 | 301 | 308 | 311 | 312 | 304 | 295 | 298 | 331 |
| Crystallization onset temperature Tx (° C.) | | 520 | 470 | 478 | 455 | 476 | 432 | 455 | 380 | 410 | 461 |
| Thermal expansion coefficient ($\times 10^{-7}$/° C.) | | 105 | 124 | 122 | 112 | 108 | 114 | 118 | 110 | 108 | 105 |
| Fluidity/vitreous luster | | B | A | A | B | B | B | B | D | D | C |
| Color shade | | Seal brown | Seal brown | Seal brown | Seal brown | Seal brown | Seal brown | Seal brown | Seal brown | Seal brown | Seal brown |

TABLE 3

|  |  | Lead-free glass material No. | | | | | | | | |
|---|---|---|---|---|---|---|---|---|---|---|
|  |  | 21 | 22 | 23 | 24 | 25 | 26 | 27 | 28 | 29 |
| Glass composition (mol %) | $V_2O_5$ | 41.8 | 42.2 | 42.2 | 42.2 | 42.2 | 41.8 | 40.7 | 40.9 | 39.8 |
|  | ZnO | 13.3 | 13.4 | 13.4 | 13.4 | 13.4 | 13.3 | 13.0 | 13.0 | 12.7 |
|  | BaO | 14.2 | 11.9 | 9.4 | 11.9 | 9.4 | 14.2 | 13.8 | 13.9 | 13.5 |
|  | $TeO_2$ | 25.7 | 26.0 | 26.0 | 26.0 | 26.0 | 25.7 | 25.1 | 25.2 | 24.5 |
|  | $Nb_2O_5$ | — | 2.0 | 2.0 | 2.0 | 2.0 | — | — | 2.0 | 2.0 |
|  | $Al_2O_3$ | — | 1.0 | 1.0 | 1.0 | 1.0 | — | — | — | — |
|  | $SiO_2$ | — | 1.0 | 1.0 | 1.0 | 1.0 | — | — | — | — |
|  | MgO | — | — | — | — | — | — | — | — | — |
|  | $Sb_2O_3$ | 5.0 | — | — | — | — | — | — | — | — |
|  | CuO | — | 2.5 | 5.0 | — | — | — | — | — | — |
|  | SnO | — | — | — | 2.5 | 5.0 | — | — | — | — |
|  | $B_2O_3$ | — | — | — | — | — | 5.0 | 7.5 | 5.0 | 7.5 |
| Glass transition point Tg (° C.) | | 299 | 285 | 282 | 280 | 274 | 289 | 300 | 307 | 308 |
| Softening point Tf (° C.) | | 321 | 303 | 301 | 296 | 291 | 310 | 327 | 326 | 329 |
| Crystallization onset temperature Tx (° C.) | | 432 | 436 | 383 | 437 | 336 | 405 | 423 | 427 | 433 |
| Thermal expansion coefficient ($\times 10^{-7}$/° C.) | | 108 | 111 | 102 | 116 | 105 | 115 | 110 | 106 | 103 |
| Fluidity/vitreous luster | | C | A | D | A | D | B/Devitrifying | | C | C |
| Color shade | | Seal brown | Seal brown | Seal brown | Seal brown | Seal brown | Seal brown | Seal brown | Seal brown | Seal brown |

From the results of Tables 1 to 3, it is obvious that lead-free glass materials (No. 2, 4, 6 to 8, and 10) of the present invention having a glass composition in which a basic combination composed of four components of $V_2O_5$, ZnO, BaO, $TeO_2$ at respective proper ratios were additionally mixed with either or both of $Nb_2O_5$ and $Al_2O_3$ in a proper range have a low glass transition point [Tg] of 275 to 295° C. and a low softening point [Tf] of 285 to 316° C., and show good fluidity and vitreous luster at a low temperature of less than 420° C. It is also obvious that the lead-free glass materials have a small thermal expansion coefficient of the glass, are far superior in low-temperature workability and sealability to a lead-free glass material (No. 1) composed of the above-described basic combination of four components originally having low fusibility, and possess high suitability for use in organic-EL sealing. It is seen that particularly the lead-free glass materials (No. 2, 4, 6, 8, and 10) in which $Nb_2O_5$ and $Al_2O_3$ were in more preferable mixed ranges have a significantly low glass transition point [Tg] of 285° C. or lower and a significantly low softening point [Tf] of 298° C. or lower, and possess extremely excellent low-temperature workability. In lead-free glass materials (No. 3, 5, 9, and 11) having too high mixing ratios of individual and total amounts of $Nb_2O_5$ and $Al_2O_3$, the thermal expansion coefficient of the glass is reduced while the glass transition point [Tg] and the softening point [Tf] are increased conversely. Thus, it is understood that the low-temperature workability is impaired on the contrary.

In lead-free glass materials (No. 12 to 14, 16, 17, 22, and 24) having a glass composition in which at least one kind of component selected from $SiO_2$, MgO, $Sb_2O_3$, CuO, and SnO was added in a proper range in addition to the four components of $V_2O_5$, ZnO, BaO, and $TeO_2$ and at least one component of $Nb_2O_5$ and $Al_2O_3$, the thermal expansion coefficient is further lowered with excellent low-temperature workability being secured. It is understood that higher sealability can be achieved. In a lead-free glass material (No. 15) having too high mixing ratios of individual and total amounts of three components of $SiO_2$, MgO, and $Sb_2O_3$, the low-temperature workability is reduced even with the thermal expansion coefficient being further lowered. Even when the mixing ratios were proper, lead-free glass materials (No. 18 to 21) without any of $Nb_2O_5$ or $Al_2O_3$ have remarkably reduced fluidity and vitreous luster in a molten state. On the other hand, lead-free glass materials (No. 23 and 25) having too high mixing ratios of two components of CuO and SnO do not show fluidity in a molten state due to crystallization.

In lead-free glass materials (No. 26 to 29) in which $B_2O_3$ was additionally mixed with the five components, including the four components of $V_2O_5$, ZnO, BaO, and $TeO_2$, plus $Nb_2O_5$, the thermal expansion coefficient is lowered as compared with the lead-free glass material (No. 1) composed of the four components. However, the following drawbacks have appeared; the low-temperature workability is not improved, the devitrification of the glass occurs, and the heating temperature for obtaining good fluidity and vitreous luster becomes high.

Manufacturing Example 2

A zirconium-based filler (zirconium phosphate having the largest particular diameter of 5.5 μm and an average particular diameter of about 1.0 μm) was mixed with powders of the lead-free glass materials No. 1 (an comparative example) and No. 12 (an implemented example) in the above Manufacturing Example 1 at a ratio shown in the following Table 4, and then refractory filler-containing lead-free glass materials No. 30 and 31 were made. The lead-free glass materials No. 30 and 31 were examined for thermal expansion coefficient, and fluidity and vitreous luster in a molten state in the same manner as above. The results are shown in Table 4 with measured values of sealing strength by the following sealing test. An evaluation of the fluidity and vitreous luster was made on a scale of the same four categories as the Manufacturing Example 1.

[Sealing Strength Test]

20 g of vehicle composed of ethyl cellulose, butyl carbitol acetate, and terpineol were added and mixed with respective 100 g of the refractory filler-containing lead-free glass materials No. 30 and 31 having been obtained in the above Manufacturing Example 2, and each frit paste was prepared. With that frit paste, one of the surfaces of a rectangular alkali-free glass substrate (having a length of 40 mm, a width of 30 mm, a thickness of 0.7 mm, and a thermal expansion coefficient of $40 \times 10^{-7}$/° C.) was coated in such a manner that the paste draws a 30×20 mm rectangle having a line width of 0.6 mm and a thickness of about 10 nm. The glass substrate was preliminarily fired in an electric furnace at 300° C. for 60 minutes. After that, an alkali-free glass substrate having the same dimension was laid on the frit-coated surface side of the glass substrate while positionally shifted in the longitudinal direction, and then the glass substrates were clipped together and fixed. The glass substrate having been preliminarily fired was faced up, and a laser beam of a semiconductor laser (having a wavelength of 808 nm) was irradiated along the coating line of the frit paste at an irradiation rate of 2 mm per second. The glass components of the frits were melted in this way and the sealing was performed. This sealed pair of glass substrates was fixed vertically, and a downward pressure was applied at a rate of 1000 N per minute or smaller to an upper end of the glass substrate having been placed at the top by the above positional shift. The sealing ability (compression shear strength) per unit area was calculated from the peak pressure when the sealed surface was peeled off. The sealing ability is shown as sealing strength in Table 4.

TABLE 4

|  |  | Filler-containing lead-free glass material No. | |
|---|---|---|---|
|  |  | 30 | 31 |
| Mixing ratio (% by weight) | Lead-free glass material No. 1 | 60 | — |
|  | Lead-free glass material No. 12 | — | 60 |
|  | Zirconium-based filler | 40 | 40 |
| Thermal expansion coefficient ($\times 10^{-7}$/° C.) | | 62.5 | 50.8 |
| Fluidity/vitreous luster | | B | A |
| Color shade | | Brown | Dark brown |
| Sealing strength (kg/mm$^2$) | | 0.472 | 0.833 |

As shown in Table 4, the refractory filler-containing lead-free glass material No. 31 which is the implemented example of the present invention has a thermal expansion coefficient much closer to that of the glass substrate of the organic EL display as compared with the refractory filler-containing lead-free glass material No. 30 of the comparative example, so that high sealability can be achieved. Furthermore, the glass material No. 31 has a nearly doubled sealing strength and also shows good fluidity and vitreous luster at a lower temperature. Thus, it is understood that the glass material No. 31 is also superior in low-temperature workability.

[Water Resistance and Chemical Resistance Tests]

The refractory filler-containing lead-free glass materials No. 30 and 31 having been obtained in the above Manufacturing Example 2 were melted and hardened within molds, and rectangular column-shaped samples of about 1 g (having a length of about 6.3 mm) were made. Rectangular column-shaped samples were soaked into liquids within containers respectively containing 500 mL water, a 1 M HCl aqueous solution, and a 1 M NaOH aqueous solution. Each container was put into a constant-temperature bath at 70° C., and the sample was taken out at every predetermined time and subjected to drying at 100° C. for 1 hour. The weight of the sample having been naturally cooled was measured, and a weight reduction rate from the initial weight was calculated by the following equation. The results are shown in Table 5.

Weight reduction rate (%)=[1−measured weight (g)/initial weight (g)]×100

TABLE 5

| Lead-free glass material | Weight reduction rate (%) Soak solution | | | | | |
|---|---|---|---|---|---|---|
| | Water | | 1M-HCl aq. solution | | M-NaOH aq. solution | |
| | No. 30 | No. 31 | No. 30 | No. 31 | No. 30 | No. 31 |
| Soaking time at 70° C. 0 | 0 | 0 | 0 | 0 | 0 | 0 |
| 24 | −0.114 | −0.299 | −6.560 | −5.495 | −2.572 | −1.416 |
| 48 | −0.239 | −0.422 | −11.945 | −9.943 | −4.672 | −2.687 |
| 144 | −0.843 | −0.860 | −23.596 | −19.945 | −10.710 | −10.591 |
| 168 | −0.977 | −0.963 | −25.584 | −21.763 | −11.718 | −11.865 |
| 192 | −1.085 | −1.017 | −27.366 | −23.325 | −12.570 | −12.829 |
| 216 | −1.213 | −1.098 | −28.866 | −24.734 | −13.466 | −13.692 |

As shown in Table 5, the refractory filler-containing lead-free glass material No. 31 of the implemented example of the present invention has superior water resistance and acid resistance and is also comparable in alkali resistance as compared with the refractory filler-containing lead-free glass material No. 30 of the comparative example. It is obvious that excellent durability can be provided to the organic EL display by using the glass material No. 31 as the sealing material.

What is claimed is:

1. A lead-free glass material for organic-EL sealing, the material comprising:

a glass composition containing, in terms of mol %, 30 to 60% $V_2O_5$, 5 to 20% ZnO, 5 to 20% BaO, 15 to 40% $TeO_2$, 0 to 7% $Nb_2O_5$, 0 to 7% $Al_2O_3$, 0 to 5% $SiO_2$, 0 to 5% MgO, 0 to 5% $Sb_2O_3$, 0 to 4% CuO, and 0 to 4% SnO, wherein $Nb_2O_5+Al_2O_3$ is 0.5 to 10%, and $SiO_2+MgO+Sb_2O_3$ is 0 to 5%, and CuO+SnO is 0 to 4%, in terms of mol%.

2. A lead-free glass material for organic-EL sealing, the material comprising:

a glass composition containing, in terms of mol %, 35 to 50% $V_2O_5$, 10 to 18% ZnO, 5 to 18% BaO, 15 to 30% $TeO_2$, 0 to 7% $Nb_2O_5$, 0 to 5% $Al_2O_3$, 0 to 5% $SiO_2$, 0 to 5% MgO, 0 to 5% $Sb_2O_3$, 0 to 4% CuO, and 0 to 4% SnO, wherein $Nb_2O_5+Al_2O_3$ is 2 to 8%, and $SiO_2+MgO+Sb_2O_3$ is 0 to 5%, and CuO+SnO is 0 to 4%, in terms of mol %.

3. The lead-free glass material for organic-EL sealing according to claim 1, wherein $SiO_2+MgO+Sb_2O_3$ in the glass composition is 0.5 to 5 mol %.

4. The lead-free glass material for organic-EL sealing according to claim 2, wherein $SiO_2+MgO+Sb_2O_3$ in the glass composition is 0.5 to 5 mol %.

5. The lead-free glass material for organic-EL sealing according to claim 1, wherein CuO+SnO in the glass composition is 0.5 to 4 mol %.

6. The lead-free glass material for organic-EL sealing according to claim 2, wherein CuO+SnO in the glass composition is 0.5 to 4 mol %.

7. The lead-free glass material for organic-EL sealing according to claim 1, wherein a glass powder having the glass composition is mixed with a filler in a range of ratio by weight of the glass powder to the filler of 50:50 to 99:1.

8. The lead-free glass material for organic-EL sealing according to claim 2, wherein a glass powder having the glass composition is mixed with a filler in a range of ratio by weight of the glass powder to the filler of 50:50 to 99:1.

9. The lead-free glass material for organic-EL sealing according to claim 1, wherein SnO is 0.5 to 4% and CuO+SnO is 0.5 to 4%, in terms of mol %.

10. The lead-free glass material for organic-EL sealing according to claim 2, wherein SnO is 0.5 to 4% and CuO+SnO is 0.5 to 4%, in terms of mol %.

* * * * *